United States Patent [19]

Kern et al.

[11] 4,395,304

[45] Jul. 26, 1983

[54] SELECTIVE ETCHING OF PHOSPHOSILICATE GLASS

[75] Inventors: Werner Kern, Hightstown, N.J.; George L. Schnable, Lansdale, Pa.

[73] Assignee: RCA Corporation, New York, N.Y.

[21] Appl. No.: 377,001

[22] Filed: May 11, 1982

[51] Int. Cl.³ .................. B44C 1/22; C03C 15/00; C03C 25/06

[52] U.S. Cl. .................. 156/657; 156/653; 156/663; 252/79.3; 252/79.4

[58] Field of Search .................. 427/88, 89; 156/644, 156/653, 657, 659.1, 662, 655, 663; 65/31; 252/79.3, 79.4, 142; 29/580; 148/187

[56] References Cited

U.S. PATENT DOCUMENTS 3,481,781 12/1969 Kern .................. 117/215
3,977,925 8/1976 Schwabe .................. 156/13
4,171,242 10/1979 Liu .................. 252/79.3
4,273,805 6/1981 Dawson et al. .................. 427/88

OTHER PUBLICATIONS

W. Kern, "Analysis of Glass Passivation Layers on Integrated-Circuit Pellets by Precision Etching", RCA Review, vol. 37, 3/76.

*Primary Examiner*—William A. Powell
*Attorney, Agent, or Firm*—Birgit E. Morris; R. Hain Swope

[57] ABSTRACT

A selective chemical etchant solution for phosphosilicate glass includes a carboxylic acid, hydrogen fluoride and water. The invention is also a method for preferentially etching the phosphosilicate glass which comprises the step of immersing the glasses in the etchant solution of the invention.

8 Claims, 4 Drawing Figures

SELECTIVE ETCHING OF PHOSPHOSILICATE GLASS

The invention relates to a method for the selective etching of a phosphosilicate glass and a useful etchant solution therefor.

BACKGROUND OF THE INVENTION

In the fabrication of electron devices in the surface of a silicon wafer, contact openings are formed through a dielectric layer, such as $SiO_2$, to specific portions of the wafer surface. The $SiO_2$ layer is typically about 200 nanometers (nm) thick and may be formed by chemical vapor deposition as disclosed by Kern in U.S. Pat. No. 3,481,781, incorporated herein by reference. The contact openings must have a smoothly varying continuous surface on which to deposit the contact and interconnect metallization, otherwise openings will occur in the metallization. To provide this smoothly varying, continuous surface it has been found useful to deposit a phosphosilicate glass (hereinafter PSG), typically containing about 6 weight percent of phosphorus, over the dielectric layer, form the contact openings through both layers and then heat the wafer to the softening temperature of the PSG. The PSG softens and flows, thereby forming the smoothly varying surface.

However, during the heating process, phosphorus can diffuse out of the PSG into the $SiO_2$ layer or into the underlying silicon itself. To prevent this from happening, a contact opening is formed through the $SiO_2$ layer using well-known photolithographic techniques and chemical etching using, for example, hydrofluoric acid or buffered hydrofluoric acid. A $Si_3N_4$ protective layer is deposited over the $SiO_2$ layer and the exposed surface silicon, and PSG is deposited over the $Si_3N_4$ layer as disclosed by Dawson et al. in U.S. Pat. No. 4,273,805, incorporated herein by reference. An opening is formed through the PSG layer over the original opening in the $SiO_2$ layer by chemical etching in a liquid solution and the wafer is heated to about 1100° C. to allow the PSG to flow. The $Si_3N_4$ layer is then removed by a selective liquid etchant which does not affect either the PSG, $SiO_2$ or silicon. However, in the process of removing the $Si_3N_4$ layer, portions of the $Si_3N_4$ layer underlying the PSG layer are also removed, leaving a recess in the otherwise smooth wall of the contact opening.

A solution to this problem would be to etch back the PSG where it overhangs the $Si_3N_4$ layer. However, known etchants for removal of PSG are not highly selective and also remove $SiO_2$ from under the $Si_3N_4$ layer with the result being that the removal of one undercut produces a second one. Thus, it would be desirable to have a selective etchant which preferentially etches PSG at a much greater rate than it etches $SiO_2$ or $Si_3N_4$.

SUMMARY OF THE INVENTION

The invention is a preferential etchant solution for PSG which includes carboxylic acid, hydrogen fluoride and water. The invention is also a method of removing a PSG overhang on a semiconductor wafer by immersion of the semiconductor wafer with the glass thereon in the preferential etchant solution of the invention.

DETAILED DESCRIPTION OF A PREFERRED EMBODIMENT

Figure 1:
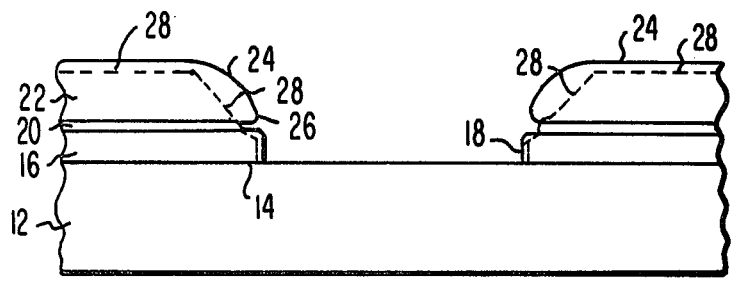
FIG. 1 is a cross-sectional illustration of a semiconductor wafer having dielectric layers thereon.

In FIG. 1 a silicon wafer 12 has, on a surface 14 thereof, an $SiO_2$ layer 16 having an opening 18 therethrough. A $Si_3N_4$ layer 20, typically about 60 nm thick, overlies the $SiO_2$ layer 16. A PSG layer 22, typically about 900 nm thick and deposited by chemical vapor deposition, overlies the $Si_3N_4$ layer 20. The PSG layer 22 has a surface 24 which is rounded and which tapers to about the same diameter as that of the opening 18 after it is softened. The $Si_3N_4$ layer 20 undercuts the PSG layer 22 leaving an overhang 26 over the edge of $Si_3N_4$ layer 20. Typically, the overhang 26 is between about 1 and about 2 times the thickness of the $Si_3N_4$ layer 20.

The overhang 26 is removed by a process which selectively etches the PSG as opposed to the $SiO_2$ and $Si_3N_4$ layers, producing a new surface 28 with no overhang of PSG over the $Si_3N_4$ layer. The selective etching of the PSG will also remove a small amount of the exposed portion of $SiO_2$ layer 16 in the region of the opening 18, but essentially none of the $Si_3N_4$ or silicon.

The etching process is carried out by immersing the wafer with the layers thereon in an etchant solution held at about 25° C. or above and which contains a carboxylic acid, hydrogen fluoride and water. Useful members of the group of carboxylic acids include formic acid (HCOOH), acetic acid ($CH_3COOH$) and propionic acid ($C_2H_5COOH$). Typically, hydrogen fluoride is added to the subject etchant solution as an aqueous solution, i.e. as hydrofluoric acid. Commercial hydrofluoric acid, which contains 49% hydrogen fluoride, is conveniently used, but other concentrations are also useful. The maximum concentration of hydrogen fluoride in water is preferred, however, to minimize the amount of water present in the solution. Thus, hydrogen fluoride dissolved in the carboxylic acid directly with a small fraction of water would also be useful.

The etchant solutions of the invention typically contain greater than 80 weight percent of a carboxylic acid and between about 1 and 10 weight percent of both hydrogen fluoride and water. Preferably, the etchant solution contains greater than 90 weight percent of the carboxylic acid and between about 2 and 5 weight percent of both hydrogen fluoride and water.

The etch rate of PSG and $SiO_2$ in a particular solution were determined by measuring the thickness of the glass layer on a silicon wafer and the immersion time in the solution required to dissolve the glass layer. The end point of the etching process at which the glass is completely removed from the silicon wafer can be clearly seen, since the solution de-wets the surface of the silicon wafer. Prior to immersion, the silicon wafer with the glass layer thereon, is typically heated to a temperature of about 800° C. in an inert atmosphere, such as nitrogen, for about 15 minutes to densify the glass layer. This heating step is useful to eliminate variables, such as layer density, which affect the etch rate.

Figure 2:
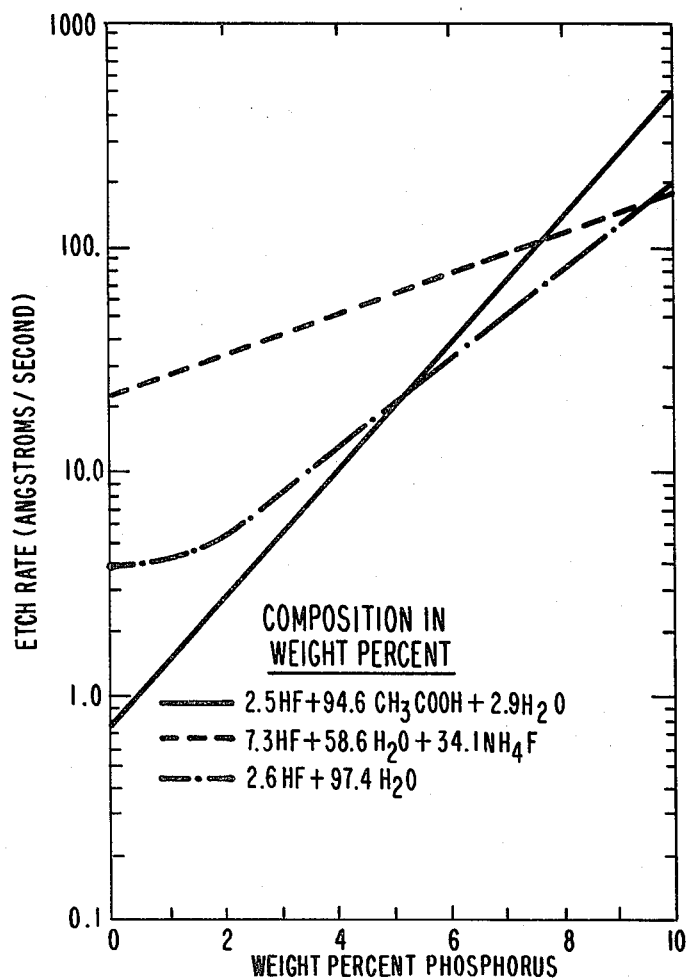
FIG. 2 is a graphical illustration of the etch rate for different etchant solutions as a function of phosphorus content of a phosphosilicate glass.

The useful parameter to be obtained from these measurements is the ratio R of the etch rate of PSG to that of $SiO_2$, with the highest ratio consistent with a reasonable etching time to be preferred. In FIG. 2 the etch rates measured using this technique are plotted as a function of phosphorus content of the glass for several different etchant solutions, with zero phosphorus content corresponding to an $SiO_2$ glass. From FIG. 2 it can be seen that the etch rate of PSG containing about 7 weight percent of phosphorus and densified at 800° C. is similar for all of the etchant solutions. However, the etch rate for $SiO_2$ is much less for the solution containing acetic acid than for the other solutions, thereby providing a much higher ratio for the solution containing acetic acid. The etch rate for glasses densified at 800° C. and containing six and zero weight percent of phosphorus in a variety of etchant solutions and the ratio of these rates are displayed in the Table. This low etch rate for $SiO_2$ in the etchant solutions of the invention is important in many applications to reduce an enlargement of the opening in the $SiO_2$ layer. The ratio of the etch rate for PSG to the etch rate for $SiO_2$ is preferably greater than 20 to minimize the increase in the diameter in the opening in the $SiO_2$ layer.

TABLE

| Absolute Weight % | | | Etch Rates at 25° C., Angstroms/Sec | | Etch Rate Ratio |
| --- | --- | --- | --- | --- | --- |
| HF | $CH_3COOH$ | $H_2O$ | $SiO_2$ | 6 wt. % P | |
| 2.5 | 94.6 | 2.9 | 0.74 | 37 | 50 |
| 4.9 | 89.8 | 5.3 | 3.0 | 112 | 37 |
| 10.6 | 78.1 | 11.3 | 12.5 | 240 | 19 |
| HF | $C_2H_5COOH$ | $H_2O$ | | | |
| 2.7 | 94.0 | 3.3 | 2.7 | 70 | 26 |
| HF | HCOOH | $H_2O$ | | | |
| 2.2 | 84.0 | 13.8 | 6.4 | 98 | 15 |
| HF | $H_2O$ | $HNO_3$ | | | |
| 2.6 | 94.4 | 3.0 | 3.5 | 44 | 13 |
| 2.6 | 97.4 | 0 | 3.9 | 30 | 8.5 |
| 5.1 | 94.9 | 0 | 7.6 | 80 | 11 |
| 11 | 89.0 | 0 | 22 | 195 | 8.9 |
| HF | $H_2O$ | $NH_4F$ | | | |
| 7.3 | 58.6 | 34.1 | 22 | 78 | 3.6 |

Figure 3:
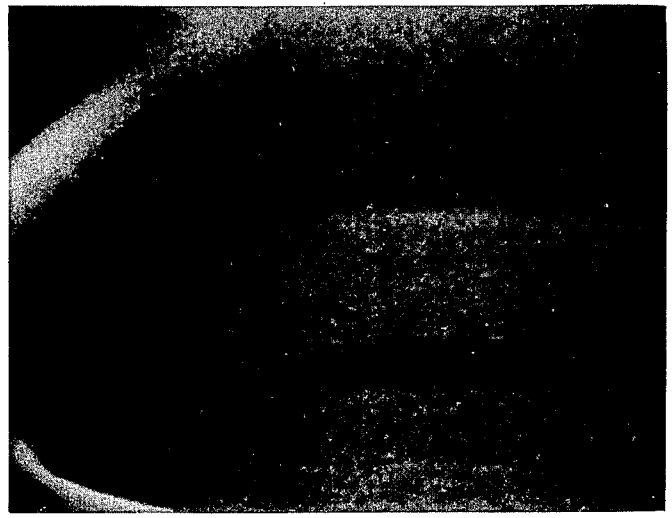
FIG. 3 is a scanning-electron micrograph of a portion of the surface of a semiconductor wafer showing the overhang of a phosphosilicate glass.
Figure 4:
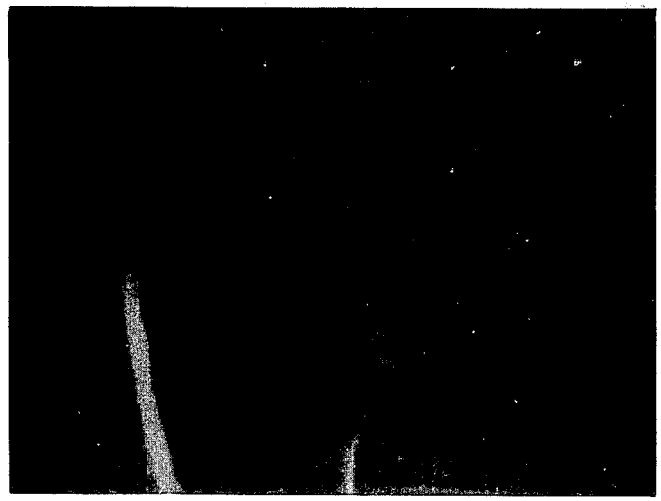
FIG. 4 is a scanning-electron micrograph of a portion of the surface of a semiconductor wafer after immersion in the etchant solution of the invention.

The effectiveness of the etching solutions of the invention were tested using a purposely misaligned silicon-on-sapphire wafer having thereon the layers described above. FIG. 3 is a scanning-electron micrograph at 20,000X of the wafer with a contact opening formed through the layers and which is ready for metallization. The micrograph shows an $SiO_2$ bottom layer and a PSG top layer with a clearly defined undercut of the $Si_3N_4$ layer below the PSG layer in the center of the picture. FIG. 4 is a micrograph at the same magnification after immersion for 15 seconds in a solution containing 94.6 weight percent of acetic acid, 2.5 weight percent of hydrogen fluoride and 2.9 weight percent of water. The $Si_3N_4$ layer is now clearly visible and the layers taper smoothly from the PSG top layer to the $SiO_2$ bottom layer.

We claim:

1. An acidic etchant solution for the preferential etching of phosphosilicate glass in the presence of silicon dioxide consisting essentially of at least about 80 weight percent of a carboxylic acid, and between about 1 and 10 weight percent of both hydrogen fluoride and water.

2. An acidic etchant solution in accordance with claim 1 wherein the carboxylic acid is acetic acid.

3. An acidic etchant solution in accordance with claim 1 wherein the solution contains at least about 90 weight percent of the carboxylic acid and between about 2 and 5 weight percent of both hydrogen fluoride and water.

4. An acidic etchant solution in accordance with claim 1 wherein the carboxylic acid is selected from the group consisting of formic acid, acetic acid and propionic acid.

5. A method of etching phosphosilicate glass at a greater rate than silicon dioxide which comprises the step of immersing said glass in an acidic etchant solution consisting essentially of at least about 80 weight percent of a carboxylic acid and between about 1 and 10 weight percent of both hydrogen fluoride and water.

6. The method in accordance with claim 5, wherein the solution contains at least about 90 weight percent of said carboxylic acid and between about 2 and 5 weight percent of both hydrogen fluoride and water.

7. The method in accordance with claim 5, wherein the carboxylic acid is acetic acid.

8. The method in accordance with claim 5 wherein the carboxylic acid is selected from the group consisting of formic acid, acetic acid and propionic acid.

* * * * *